United States Patent
Park

(10) Patent No.: US 7,038,643 B2
(45) Date of Patent: May 2, 2006

(54) BI-DIRECTIONAL DRIVING CIRCUIT FOR LIQUID CRYSTAL DISPLAY DEVICE

(75) Inventor: Jae Deok Park, Kyongsangbuk-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 495 days.

(21) Appl. No.: 10/453,651

(22) Filed: Jun. 4, 2003

(65) Prior Publication Data

US 2004/0113878 A1 Jun. 17, 2004

(30) Foreign Application Priority Data

Dec. 17, 2002 (KR) ............... 10-2002-0080711

(51) Int. Cl.
*G09G 3/36* (2006.01)

(52) U.S. Cl. .................... 345/87; 345/92; 345/94; 345/197

(58) Field of Classification Search ............ 345/87, 345/92
See application file for complete search history.

(56) References Cited

U.S. PATENT DOCUMENTS

| 4,799,057 | A | * | 1/1989 | Takeda et al. .............. 345/103 |
| 6,104,370 | A | * | 8/2000 | Nakagaki et al. ........... 345/100 |
| 2002/0093494 | A1 | * | 7/2002 | Hanari ....................... 345/204 |
| 2002/0186196 | A1 | | 12/2002 | Park ........................... 345/100 |

FOREIGN PATENT DOCUMENTS

| EP | 0615250 | 9/1994 |
| FR | 2787913 | 6/2000 |

OTHER PUBLICATIONS

Y.L. Yao, "Dynamic Shift Register Cyclic Encoder", *IBM Technical Disclosure Bulletin,* vol. 12, No. 11 (Apr. 1970), pp. 1936-1938.

* cited by examiner

*Primary Examiner*—Kent Chang
*Assistant Examiner*—Seokyun Moon
(74) *Attorney, Agent, or Firm*—McKenna Long & Aldridge LLP

(57) ABSTRACT

A driving device includes a plurality of blocks arranged in sequence, each of the blocks includes ninth switching elements connected to received a start pulse, four clock signals, and two source voltages. The switching elements are arranged to output the four clock signals in sequence and to alternatively output the four clock signals in a reverse sequence.

15 Claims, 12 Drawing Sheets

BI-DIRECTIONAL DRIVING CIRCUIT FOR LIQUID CRYSTAL DISPLAY DEVICE

The present invention claims the benefit of Korean Application No. P2002-80711 filed in Korea on Dec. 17, 2002, which is hereby incorporated by reference.

BACKGROUND OF THE INVENTION

1. Field of the Invention

The present invention relates to a driving circuit of a liquid crystal display (LCD) device, and more particularly, to a bi-directional driving circuit of a LCD panel that enables a bi-directional driving regardless of the number of stages.

2. Discussion of the Related Art

In general, a LCD device commonly includes a driving circuit in an LCD panel, such as a gate driving integrated circuit (IC) and a data driving IC. Also, the LCD device has a fixed driving direction, so that system makers sometimes require various panels.

FIG. 1 is a circuit diagram of a liquid crystal display (LCD) panel according to the related art. In FIG. 1, a polysilicon thin film transistor liquid crystal display (TFT LCD) panel includes a pixel array, a plurality of first shift registers 11, a plurality of first buffers 12, a plurality of second shift registers 13, and a plurality of second buffers 14. In particular, the pixel array has a plurality of gate lines $G_1$–$G_m$ crossing a plurality of data lines $D_1$–$D_n$, such that the first shift registers 11 and buffers 12 supply scan signals GCLK and GSTART to each of the plurality of gate lines $G_1$–$G_m$, and the second shift registers 13 and buffers 14 supply other scan signals DCLK and DSTART to the plurality of data lines $D_1$–$D_n$.

In addition, the plurality of data lines $D_1$–$D_n$ are divided into a k-number of blocks, such that there are a k-number of second shift registers 13 and buffers 14, and each of the k-number of second shift registers 13 and buffers 14 supplies scan signals through one of lines $d_1$–$d_k$ to each of the k-number of blocks of data lines $D_1$–$D_n$. Moreover, the LCD panel includes a signal bus 15 having a plurality of signal lines $s_1$–$s_n$ for transmitting video signals output from a digital-to-analog converter of a data driving circuit (not shown) to each of the plurality of data lines $D_1$–$D_n$, and a plurality of switching elements 16 for sequentially supplying video signals of the signal lines $s_1$–$s_n$ to each of the k-number of blocks of the data lines $D_1$–$D_n$ based on signals output from the second shift registers 13 and buffers 14.

Thus, by dividing the data lines $D_1$–$D_n$ into blocks, the driving circuit has a reduced number of contact lines between an external circuit and the panel. However, in the block arrangement of the data lines $D_1$–$D_n$, the gate lines and the data lines are sequentially driven by the shift registers to display limited picture images. For example, since the shift registers shift in a fixed direction, the driving circuit then does not have freedom in a driving direction as required by some system makers, thereby requiring various panels.

FIG. 2 is a circuit diagram of a shift register of a LCD panel according to the related art. In FIG. 2, a start pulse VST, four clock signals CLK1–CLK4 each having different phases, and power source voltages Vdd and Vss are input to a shift register. In addition, the shift register includes eight blocks of transistors each having similar structures, such that the power source voltages Vdd and Vss are similarly supplied to each of the eight blocks, but the four clock signals CLK1–CLK4 are differently supplied to each of the eight blocks.

In particular, each of the eight blocks of transistors includes first, second, third, fourth, fifth, sixth, and seventh p-MOS transistors TFT1–TFT7. The first transistor TFT1 has drain and gate terminals connected to either a VST terminal to which the start pulse VST is supplied to, or an output terminal of the previous block. Thus, in the first block, the drain and gate terminals of the first transistor TFT1 are connected to the VST terminal, and in the second block, the drain and gate terminals of the first transistor TFT1 are connected to a first output terminal Output1 of the first block.

In addition, the second transistor TFT2 has a drain terminal connected to a source terminal of the first transistor TFT1, and a gate terminal to which one of the four clock signals CLK1–CLK4 is supplied. For example, in the first block, the fourth clock signal CLK4 is supplied, and in the second block, the first clock signal CLK1 is supplied. The third transistor TFT3 has a source terminal connected to a source terminal of the second transistor TFT2, and a drain terminal connected to a Vss terminal to which the power source voltage Vss is supplied to. The fourth transistor TFT4 has a drain terminal connected to a Vdd terminal to which the power source voltage Vdd is supplied to, a gate terminal to which another one of the four clock signals CLK1–CLK4 is supplied, and a source terminal connected to a gate terminal of the third transistor TFT3. For example, in the first block, the third clock signal CLK3 is supplied, and in the second block, the fourth clock signal CLK4 is supplied.

Furthermore, the fifth transistor TFT5 has a drain terminal connected to the gate terminal of the third transistor TFT3 and the source terminal of the fourth transistor TFT4, and a source terminal connected to the Vss terminal. The fifth transistor TFT5 also has a gate terminal connected to either the VST terminal or the output terminal of the previous block. Thus, in the first block, the gate terminal of the fifth transistor TFT5 is connected to the VST terminal, and in the second block, the gate terminal of the fifth transistor TFT5 is connected to the first output terminal, Output1.

Moreover, the sixth transistor TFT6 has a drain terminal to which one of the four clock signals CLK1–CLK4 is supplied, and a gate terminal connected to a node Q that is also connected to the source terminals of the second and third transistors TFT2 and TFT3. For example, in the first block, the first clock signal CLK1 is supplied, and in the second block, the second clock signal CLK2 is supplied. The sixth transistor TFT6 further has a source terminal connected to a corresponding output terminal. For example, in the first block, the source terminal of the sixth transistor TFT6 is connected to the first output terminal Output1, and in the second block, the source terminal of the sixth transistor TFT6 is connected to the second output terminal Output2. The seventh transistor TFT7 has a drain terminal connected to the corresponding output terminal, a source terminal connected to the Vss terminal, and a gate terminal connected to another node QB that is also connected to the gate terminal of the third transistor TFT3, the drain terminal of the fifth terminal TFT5, and the source terminal of the fourth transistor TFT4.

Furthermore, a first capacitor C1 connects and grounds the source terminal of the second transistor TFT2 and the drain terminal of the third transistor TFT3. At the node Q, a second capacitor connects the gate terminal of the sixth transistor TFT6 to the Vss terminal. A third capacitor connects the gate and the source terminals of the sixth, transistor TFT6. At node QB, a fourth capacitor connects the gate terminal of the seventh transistor TFT7 and the Vss terminal.

In general, an output terminal of a previous block is connected to the drain and gate terminals of the first transistor TFT1 of the next block and to the gate terminal of the fifth transistor TFT5 of the next block. For example, the first output terminal Output1 is connected to the drain and gate terminals of the first transistor TFT1 of the second block and the gate terminal of the fifth transistor TFT5 of the second block. In addition, the first clock signal CLK1 is supplied to the drain terminal of the sixth transistor TFT6 in each of the first and the fifth blocks, the gate terminal of the second transistor TFT2 in each of the second and sixth blocks, and the gate terminal of the fourth transistor TFT4 in each of the third and seventh blocks. The second clock signal CLK2 is supplied to the drain terminal of the sixth transistor TFT6 in each of the second block and the sixth blocks, the gate terminal of the second transistor TFT2 in each of the third and seventh blocks, and the gate terminal of the fourth transistor TFT4 in each of the fourth and eight blocks.

Moreover, the third clock signal CLK3 is supplied to the gate terminal of the fourth transistor TFT4 in each of the first and fifth blocks, the drain terminal of the sixth transistor TFT6 in each of the third block and the seventh blocks, and the gate terminal of the second transistor TFT2 in each of the fourth and eighth blocks. The fourth clock signal CLK4 is supplied to the gate terminal of the second transistor TFT2 of each of the first and fifth blocks, the gate terminal of the fourth transistor TFT4 in each of the second and sixth blocks, and the drain terminal of the sixth transistor TFT6 in each of the fourth block and the eighth blocks.

FIG. 3 illustrates input and output waveforms of the shift register of the LCD panel of FIG. 2. In FIG. 3, the clock signals CLK1–CLK4 are sequentially LOW. For example, during a first time period, 0s–20 μs, the start pulse VST is LOW (0 V). Thus, in the first block, the first transistor TFT1 is turned ON, and the fifth transistor TFT5 is turned ON. Also, the fourth clock signal CLK4 is LOW and the second transistor TFT2 is also turned ON. Accordingly, the node Q becomes LOW, thereby turning the sixth transistor TFT6 ON. As a result, the first clock signal CLK1 is output to the first output terminal Output1. In addition, because the fifth transistor TFT5 is turned ON, the node QB is HIGH (10V), thereby turning the seventh transistor TFT7 OFF. Accordingly, the power source voltage Vss is not output to the first output terminal Output1.

During a second time period, 20μs–40 μs, the first clock signal CLK1 is LOW, which is the output of the first block, and is supplied to the drain and gate terminals of the first transistor TFT1 of the second block and the gate terminal of the fifth transistor TFT5 of the second block. Thus, in the second block, the first, second, and fifth transistors TFT1, TFT2, and TFT5 are turned ON, such that the node Q is HIGH, thereby turning the sixth transistor TFT6 ON. Accordingly, the second clock signal CLK2 is output to the second output terminal Output2. Similarly, because the fifth transistor TFT5 is turned ON, the node QB is HIGH, thereby turning the seventh transistor TFT7 OFF. Accordingly, the power source voltage Vss is not output to the second output terminal Output2.

However, the LCD panel according to the related art is disadvantageous. For example, picture images can be scanned only in an originally designed direction of the LCD panel, such that the LCD panel must generate images in the order of the first block to the last block. Accordingly, LCD has only one fixed orientation, such that the LCD panel is not versatile and can not be flipped from a landscape orientation to a portrait type orientation.

FIG. 4 is a circuit diagram of a bi-directional shift register of an LCD panel according to the related art and U.S. patent application Ser. No. 10/082,125. In FIG. 4, a gate or data start pulse VST, four clock signals CLK1–CLK4 each having different phases, and power source voltage Vdd and Vss may be input to a shift register. In addition, the shift register may include eight blocks of transistors each having similar structures, such that power source voltages Vdd and Vss may be similarly supplied to each of the eight blocks, but the four clock signals CLK1–CLK4 may be differently supplied to each of the eight blocks.

In particular, each of the eight blocks may includes first, second, third, fourth, fifth, sixth, seventh, eighth, and ninth p-MOS transistor TFT1–TFT9. The first transistor may have drain and gate terminals connected to either a VST input terminal to which the start pulse VST is supplied, or an output terminal of the previous block. Thus, in the first block, the drain and gate terminals of the first transistor TFT1 may be connected to the VST input terminal, and in the second block, the drain and gate terminals of the first transistor TFT1 may be connected to a first output terminal Output1.

In addition, the second transistor TFT2 may have a drain terminal connected to a source of the first transistor TFT1, and a gate terminal to which one of the four clock signals CLK1–CLK4 is supplied. For example, in the first block, the fourth clock signal CLK4 may be supplied, and in the second block, the first clock signal CLK1 may be supplied. The third transistor TFT3 may have a source terminal connected to a source of the second transistor TFT2, and a drain terminal connected to a Vss terminal to which the power source voltage Vss is supplied. The fourth transistor TFT4 may have a drain terminal connected to a Vdd terminal to which the power source voltage Vdd supplied, and a gate terminal to which another one of the four clock signals CLK1–CLK4 is supplied, and a source terminal connected to a gate terminal of the third p-MOS transistor TFT3. For example, in the first block, the third clock signal CLK3 may be supplied, and in the second block, the fourth clock signal CLK4 may be supplied.

Further, the fifth transistor TFT5 may have a drain terminal connected at a node QB to the gate terminal of the third transistor TFT3 and the source terminal of the fourth transistor TFT4, a gate terminal connected to a node Q, which is also connected to the source terminals of the second and third transistors TFT2 and TFT3, and a source terminal connected to the Vss terminal. The sixth transistor TFT6 may have a drain terminal to which one of the four clock signals CLK1–CLK4 is supplied, a gate terminal connected to the node Q, and a source terminal connected to a corresponding output terminal. For example, in the first block, the first clock signal CLK1 may be supplied, and in the second block, the second clock signal CLK2 may be supplied. In addition, in the first block, the source terminal of the sixth transistor TFT6 may be connected to the first output terminal Output1, and in the second block, the source terminal of the sixth transistor may be connected to the second output terminal Output2.

Moreover, the seventh transistor TFT7 may have a drain terminal connected to the corresponding output terminal, a gate terminal connected to the node QB, and a source terminal connected to the Vss terminal. The eighth transistor TFT8 may have drain and gate terminals connected to an output terminal of the next block, and a source terminal connected to the source terminal of the first transistor TFT1. For example, in the first block, the drain and gate terminals of the eight transistor may be connected to the second output terminal Output2. The ninth transistor TFT9 may be connected in parallel to the second transistor TFT2, such that the drain terminal of the ninth transistor TFT9 may be connected to the source terminal of the second transistor TFT2, and the source terminal of the ninth transistor TFT9 may be connected to the drain terminal of the second transistor TFT2. In addition, the ninth transistor may have a gate terminal to which one of the four clock signals CLK1–CLK4 is supplied. For example, in the first block, the second clock signal CLK2 may be supplied, and in the second block, the third clock signal CLK3 may be supplied.

Furthermore, a first capacitor may connect to and ground the source terminal of the first transistor TFT1, the drain terminal of the second transistor TFT2, and the source terminals of the eighth and ninth transistors TFT8 and TFT9. A second capacitor may connect the gate terminal of the sixth p-MOS transistor TFT6 to the Vss terminal. A third capacitor C3 may connect to the gate and source terminals of TFT6. A fourth capacitor C4 may connect the gate terminal of the seventh p-MOS transistor TFT7 to the Vss terminal. Accordingly, the first clock signal CLK1 may be supplied to the drain terminal of the sixth p-MOS transistor TFT6 in the first and fifth blocks, the gate terminal of the second p-MOS transistor TFT2 in the second and sixth blocks, the gate terminal of the fourth p-MOS transistor TFT4 in the third and seventh blocks, and the gate terminal of the ninth p-MOS transistor TFT9 in the fourth and eighth blocks. The second clock signal CLK2 may be supplied to the gate terminal of the ninth p-MOS transistor TFT9 in the first and fifth blocks, the drain terminal of the sixth p-MOS transistor TFT6 in the second and sixth blocks, the gate terminal of the second p-MOS transistor TFT2 in the third and seventh blocks, and the gate terminal of the fourth p-MOS transistor TFT4 in the fourth and eighth blocks.

Also, the third clock signal CLK3 may be supplied to the gate terminal of the fourth p-MOS transistor TFT4 in the first and fifth blocks, the gate terminal of the ninth p-MOS transistor TFT9 in the second and sixth blocks, the drain terminal of the sixth p-MOS transistor TFT6 in the third and seventh blocks, and the gate terminal of the second p-MOS transistor TFT2 in the fourth and eighth blocks. The fourth clock signal CLK4 may be supplied to the gate terminal of the second p-MOS transistor TFT2 in the first and fifth blocks, the gate terminal of the fourth p-MOS transistor TFT4 in the second and sixth blocks, the gate terminal of the ninth p-MOS transistor TFT9 in the third and seventh blocks, and the drain terminal of the sixth p-MOS transistor TFT6 in the fourth and eighth blocks.

FIG. 5 illustrates forward input and output waveforms of the shift register of the LCD panel of FIG. 4. In FIG. 5, the clock signals CLK1–CLK4 may be sequentially set LOW. For example, during a first time period, 0 s–20 µs, the start pulse VST may be set LOW (0V). Thus, in the first block in FIG. 4, the first and fifth transistors TFT1 and TFT5 may be turned ON. Also, the fourth clock signal CLK4 may be set LOW, thereby turning the second transistor TFT2 ON. Accordingly, the node Q may become LOW, thereby turning the sixth transistor TFT6 ON. As a result, the first clock signal CLK1 may be outputted to the first output terminal Output1. In addition, because the fifth transistor TFT5 may be turned ON, the node QB may be set HIGH (10V), thereby turning the seventh transistor OFF. Accordingly, the power source voltage Vss may not be outputted to the first output terminal Output1.

In addition, during a second time period, 20 µs–40 µs, the first clock signal CLK1 may be set LOW, which is the output of the first block, and may be supplied to the drain and gate terminals of the first transistor TFT1 of the second block. Thus, in the second block, the first and second transistors TFT1 and TFT2 may be turned ON, thereby turning the sixth transistor TFT6 ON. As a result, the second clock signal CLK2 may be outputted to the second output terminal Output2.

FIG. 6 illustrates backward input and output waveforms of the shift register of the LCD panel of FIG. 4. In FIG. 6, the clock signals CLK1–CLK4 may be set LOW in reverse sequence. For example, during a first period, 0 s–20 µs, the start pulse VST may be set LOW. Thus, in the first block, the first transistor TFT1 may be turned ON. Also, the fourth clock signal CLK4 may be set HIGH, thereby turning the second transistor TFT2 OFF. As a result, the sixth transistor TFT6 may be turned OFF, thereby failing to output the first clock signal CLK1 to the first output terminal Output1.

However, in the eighth block, the first transistor TFT1 and the ninth transistor TFT9 may be both turned ON. As a result, the sixth transistor TFT6 of the eighth block may be turned ON, thereby outputting the fourth clock signal CLK4 to the eight output terminal Output8.

In addition, the output signal from the eighth output terminal Output8 may be supplied to the eighth transistor TFT8 of the seventh block. Then, the fourth clock signal CLK4 may be set LOW, thereby turning the eighth and ninth transistors TFT8 and TFT9 in the seventh block ON. As a result, the sixth transistor TFT6 of the seventh block may be turned ON, thereby outputting the third clock signal CLK3 to the seventh output terminal Output7.

Accordingly, the start pulse VST may be synchronized with the first clock signal CLK1 to output the fourth to first clock signals CLK4–CLK1 in sequence, starting from the eighth block to the first block. Thus, the shift register of FIG. 4 may provide both forward and backward scanning in a LCD panel, such that the LCD panel may function in both landscape and portrait orientations. However, such LCD panel may experience image distortions when it has a number of blocks of transistors that is not a multiple of 4.

FIG. 7 is a circuit diagram of a shift register of an LCD panel having five stages of FIG. 4. In FIG. 7, a shift register may have first, second, third, fourth and fifth blocks of p-MOS transistors similar to the first-fourth blocks of transistors in FIG. 4, except the gate and drain terminals of the eighth transistor in the fifth block may be connected to the VST terminal.

FIG. 8 illustrates forward input and output waveforms of the shift register of the LCD panel of FIG. 7. In FIG. 8, the four clock signals CLK1–CLK4 may be set LOW in sequence. For example, during a first time period, 0 s–20 µs when the start pulse VST may be LOW, in the first block, the first transistor TFT1 may be ON). Also, the fourth clock signal CLK4 may be LOW, the second transistor TFT2 may be ON. As a result, the node Q may become LOW, thereby turning the sixth transistor TFT6 ON. Accordingly, the first clock signal CLK1 may be outputted to the first output terminal Output1. In addition, the node QB may become HIGH, thereby turning the seventh transistor TFT7 OFF. Accordingly, the Vss voltage may not be outputted to the first output terminal Output1.

In addition, during the first time period, the LOW-level start pulse VST may also be inputted to the gate terminal of the eighth transistor TFT8 in the fifth block. Since the fourth clock signal CLK4 may also be LOW, the second transistor TFT2 may be turned ON. As a result, the node Q may be LOW, thereby turning the sixth transistor TFT6 ON. Hence, the first clock signal CLK1 may also be outputted to the fifth output terminal Output5. Accordingly, two outputs may be erroneously generated both at the first and fifth output terminals Output1 and Output5 during about 20–40 μs.

FIG. 9 illustrates backward input and output waveforms of the shift register of the LCD panel of FIG. 7. In FIG. 9, two outputs may also erroneously generated both at the first and fifth output terminals Output1 and Output5 during about 20–40 μs.

SUMMARY OF THE INVENTION

Accordingly, the present invention is directed to a bi-directional driving circuit of a liquid crystal display (LCD) panel that substantially obviates one or more problems due to limitations and disadvantages of the related art.

An object of the present invention is to provide to a bi-directional driving circuit of a liquid crystal display (LCD) panel, which can scan in forward and backward directions without an additional input pad, and enables a bi-directional driving regardless of the number of stages.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the driving device of a liquid crystal display (LCD) panel includes a plurality of blocks arranged in sequence, each of the blocks comprising: a first switching element having drain and gate terminals to which one of a start pulse and an output signal of a previous block in the sequence is supplied, a second switching element having a drain terminal connected to a source terminal of the first switching element, and a gate terminal to which a first clock signal is supplied, a third switching element having a source terminal connected to a source terminal of the second switching element, and a drain terminal connected to a first voltage input terminal, a fourth switching element having a drain terminal connected to a second voltage input terminal, a gate terminal to receive a second clock signal that is not supplied to the second switching element, and a source terminal connected to a gate terminal of the third switching element, a fifth-switching element having a drain terminal connected to the source terminal of the fourth switching element, a gate terminal connected to a contact node between the source terminals of the second and third switching elements, and a source terminal connected to the first voltage input terminal, a sixth switching element having a drain terminal to receive a third clock signal that is not supplied to the second and fourth switching elements, a gate terminal connected to the contact node, and a source terminal connected to a corresponding output terminal, a seventh switching element having a drain terminal connected to the corresponding output terminal, a gate terminal connected to the source terminal of the fourth switching element and the gate terminal of the third switching element, and a source terminal connected to the first voltage input terminal, an eighth switching element having drain and gate terminals to which one of the start pulse is supplied and connected to an output terminal of the next block in the sequence, and a ninth switching element having a source terminal connected to the source terminal of the eighth switching element, a gate terminal to receive a fourth clock signal that is not supplied to the second, fourth, and sixth switching elements, and a drain terminal connected to the source terminal of the second switching element and the gate terminal of the sixth switching element.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
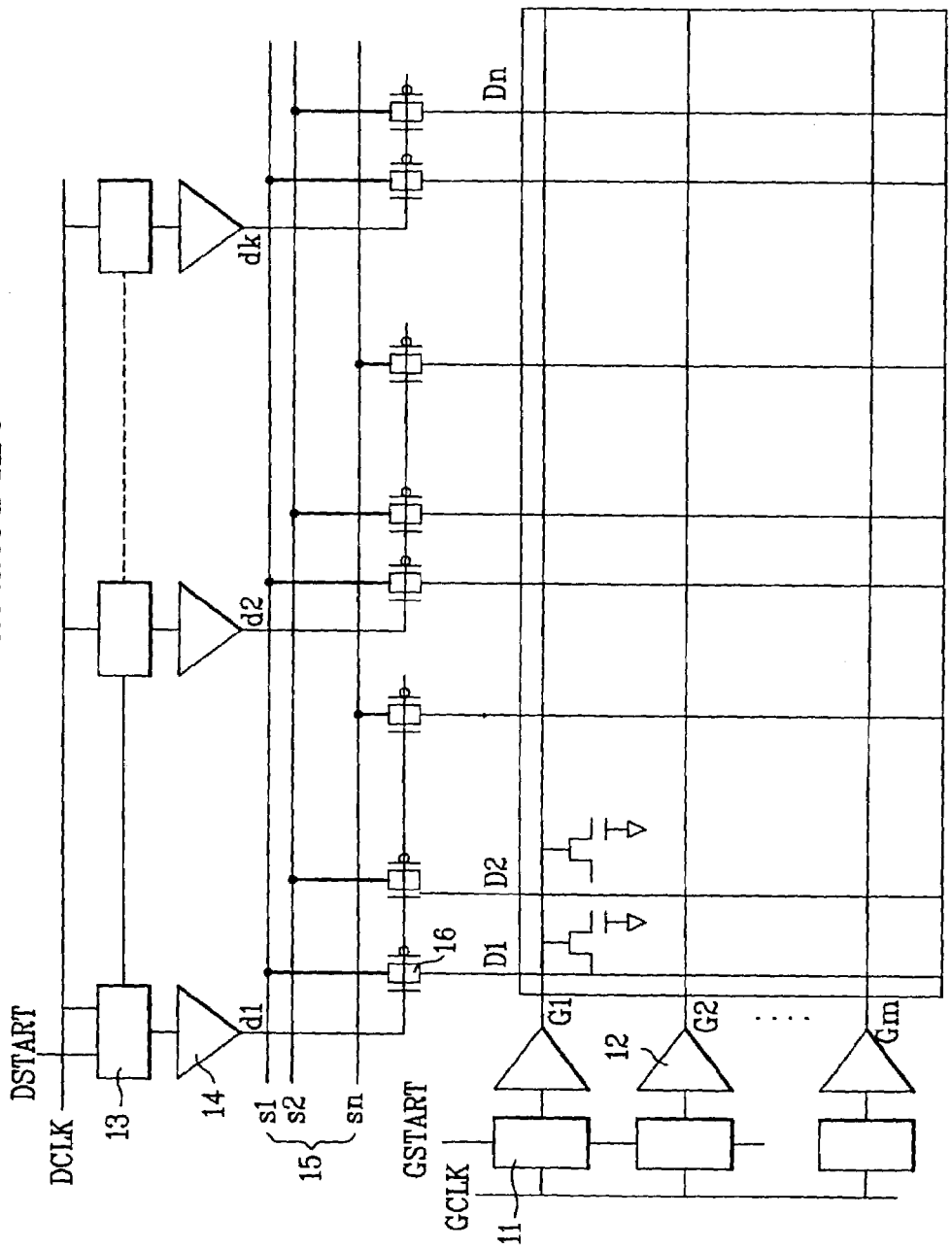
FIG. 1 is a circuit diagram of a liquid crystal display (LCD) panel according to the related art.
Figure 2:
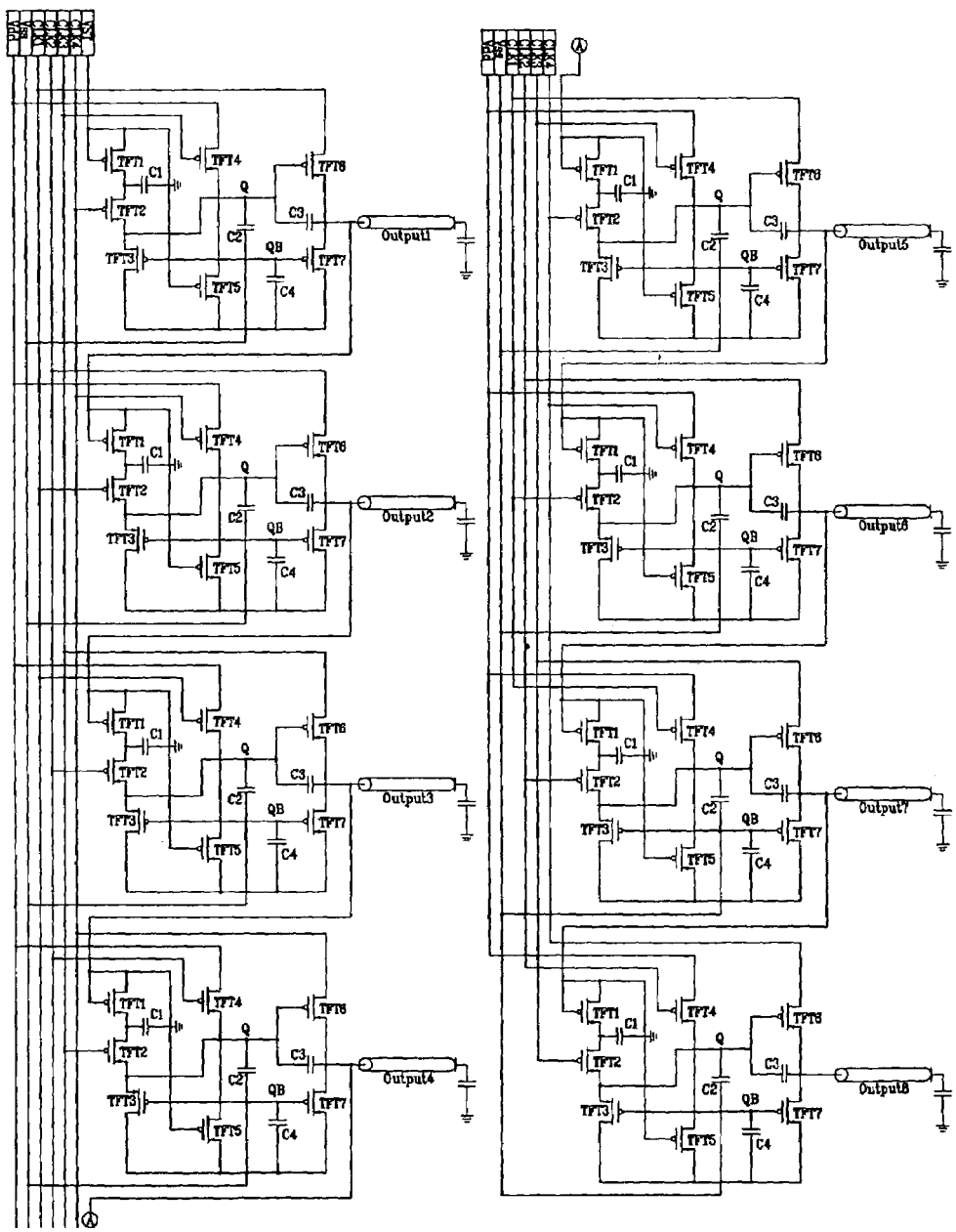
FIG. 2 is a circuit diagram of a shift register of a LCD panel according to the related art.
Figure 3:
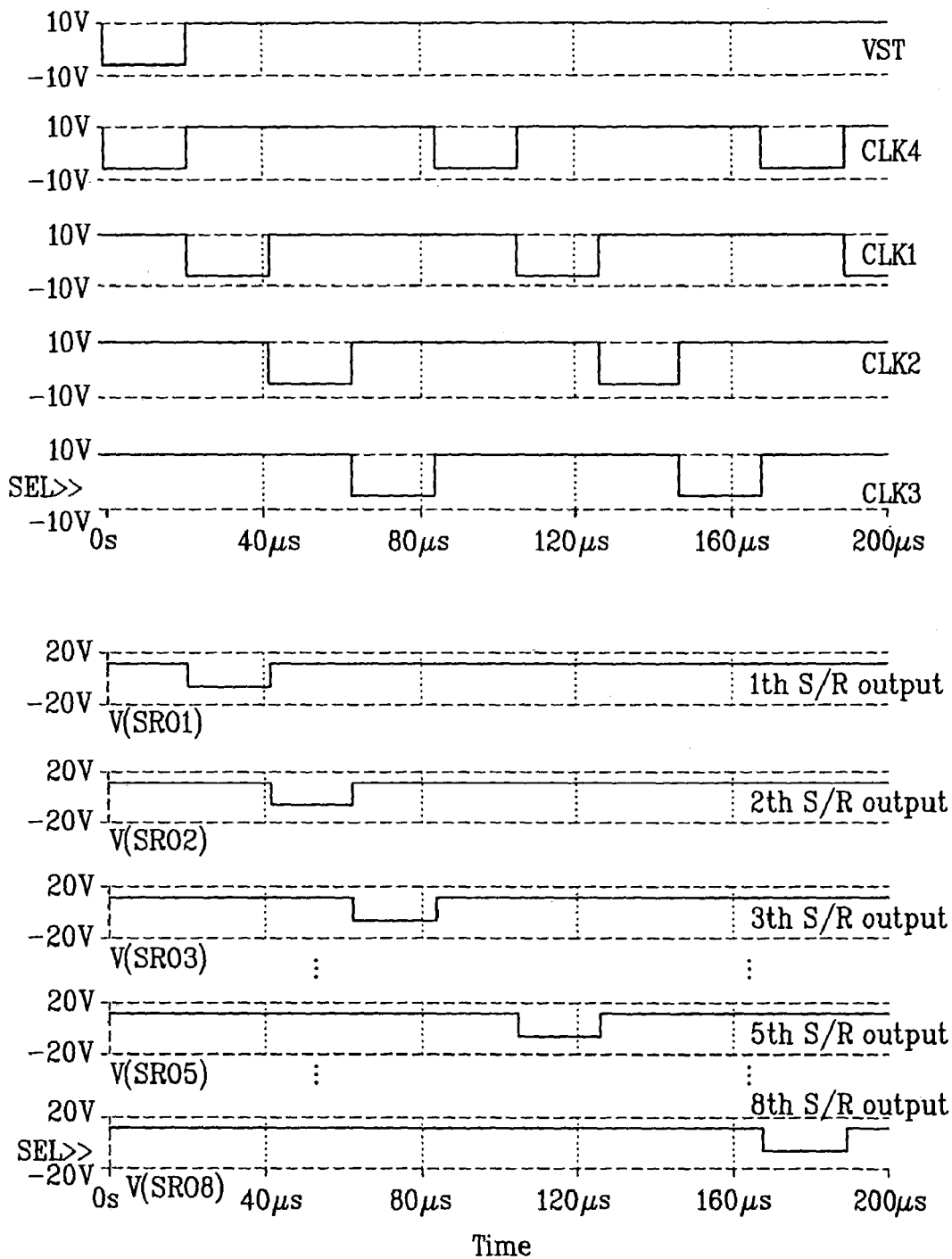
FIG. 3 illustrates input and output waveforms of the shift register of the LCD panel of FIG. 2.
Figure 4:
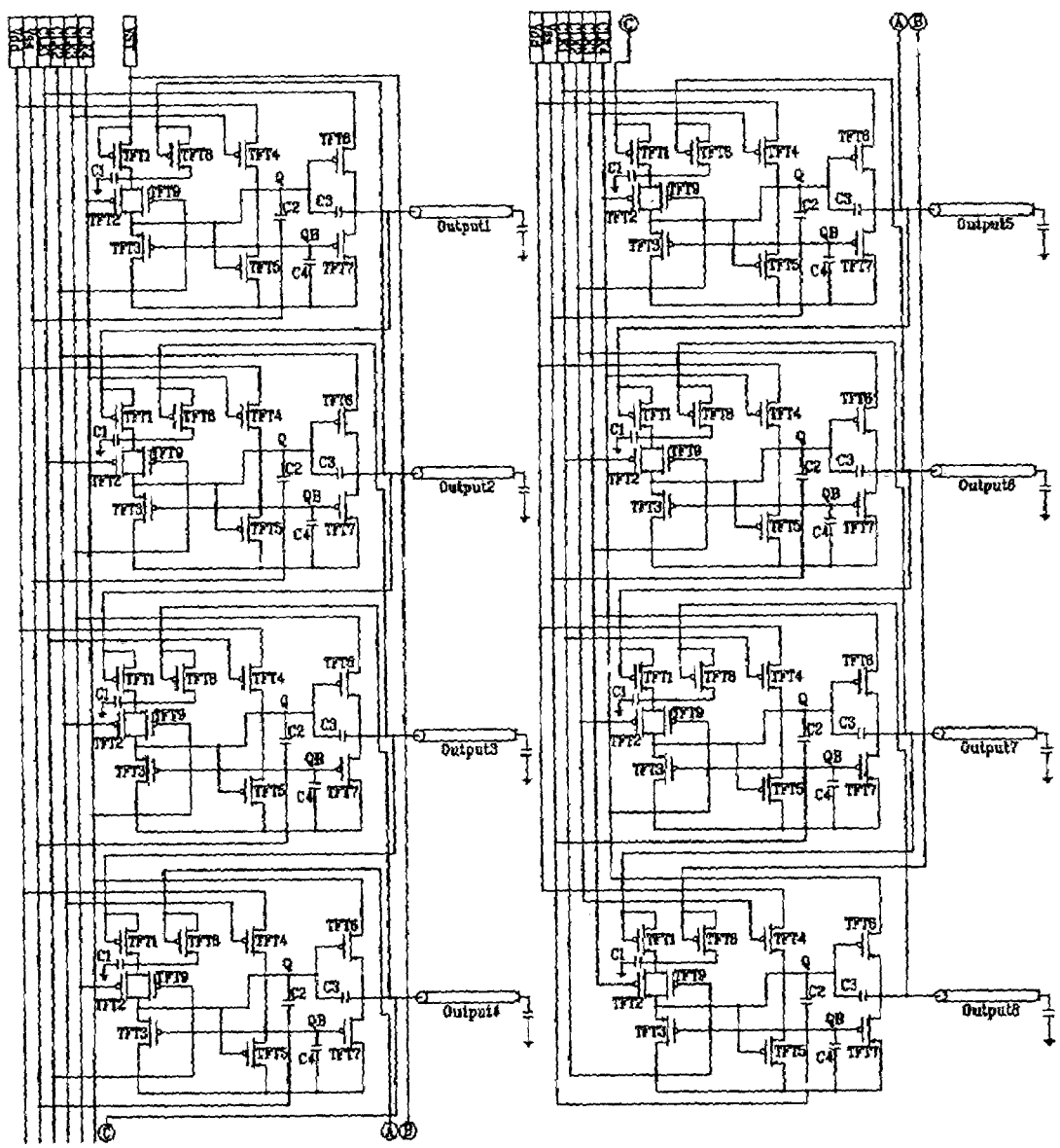
FIG. 4 is a circuit diagram of a bi-directional shift register of an LCD panel according to the related art.
Figure 5:
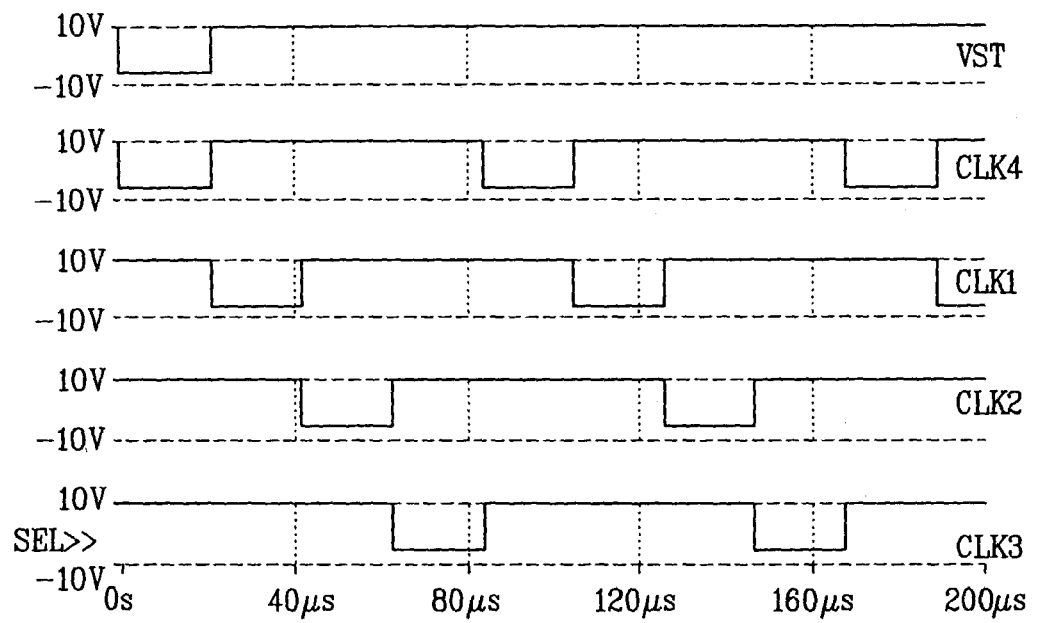
FIG. 5 illustrates forward input and output waveforms of the shift register of the LCD panel of FIG. 4 according to the related art.
Figure 5:
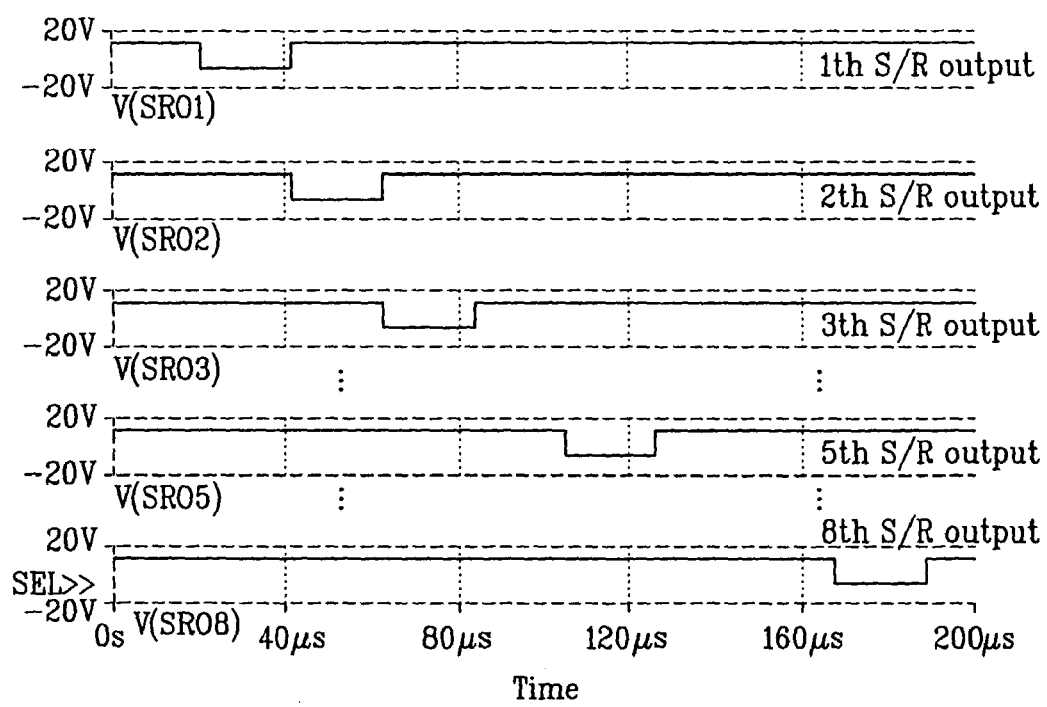
Figure 6:
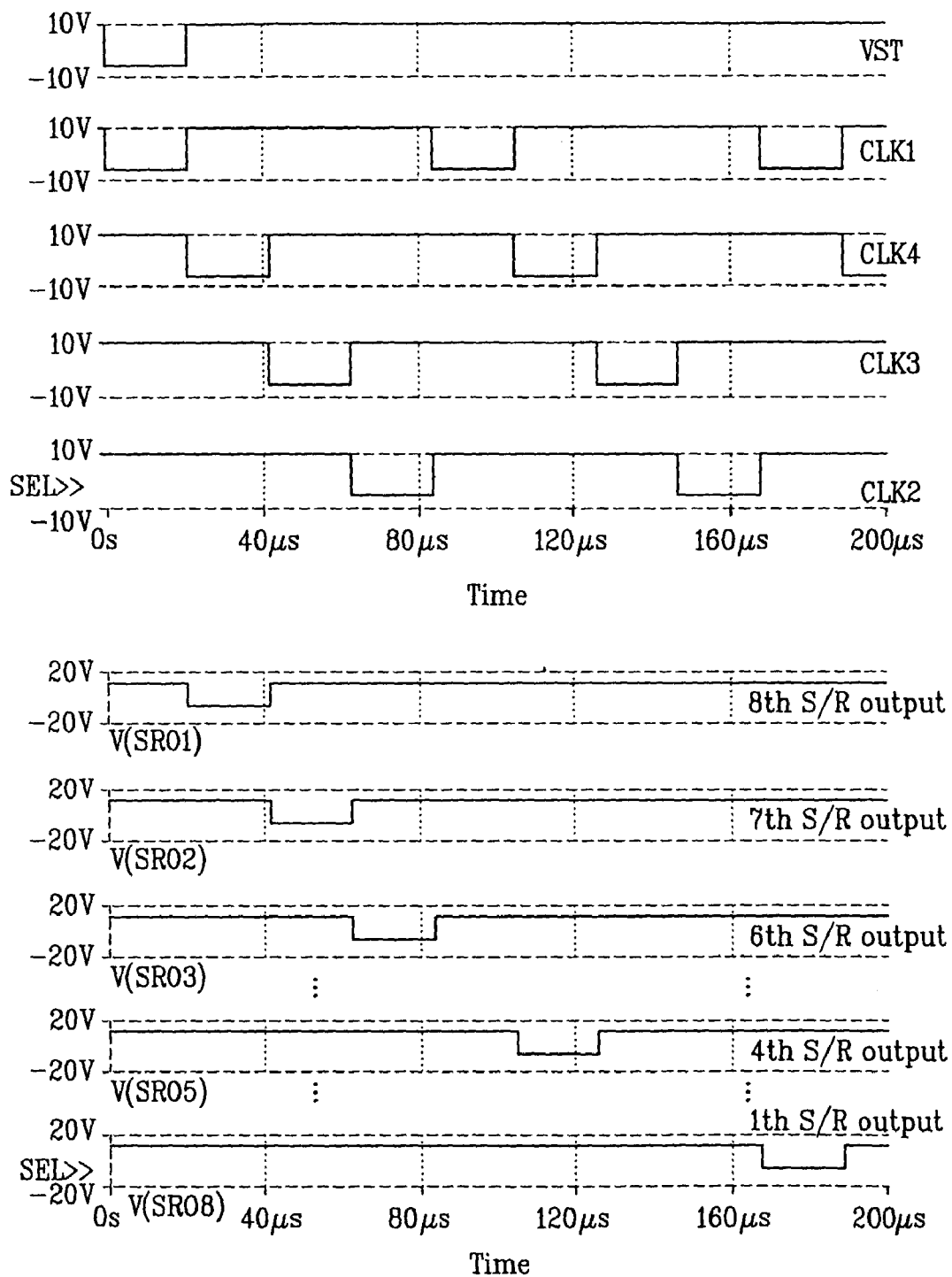
FIG. 6 illustrates backward input and output waveforms of the shift register of the LCD panel of FIG. 4 according to the related art.
Figure 7:
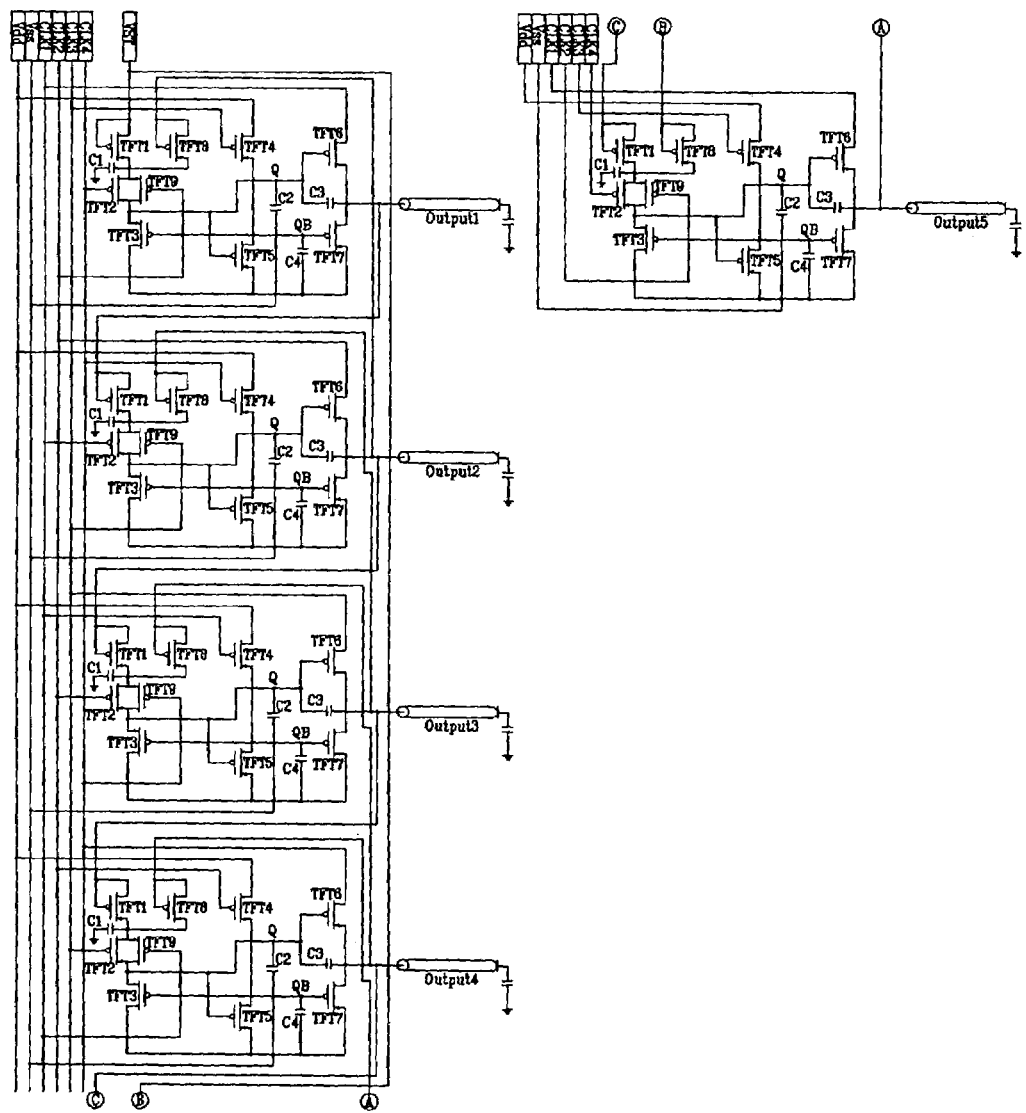
FIG. 7 is a circuit diagram of a shift register of an LCD panel having five stages of FIG. 4 according to the related art.
Figure 8:
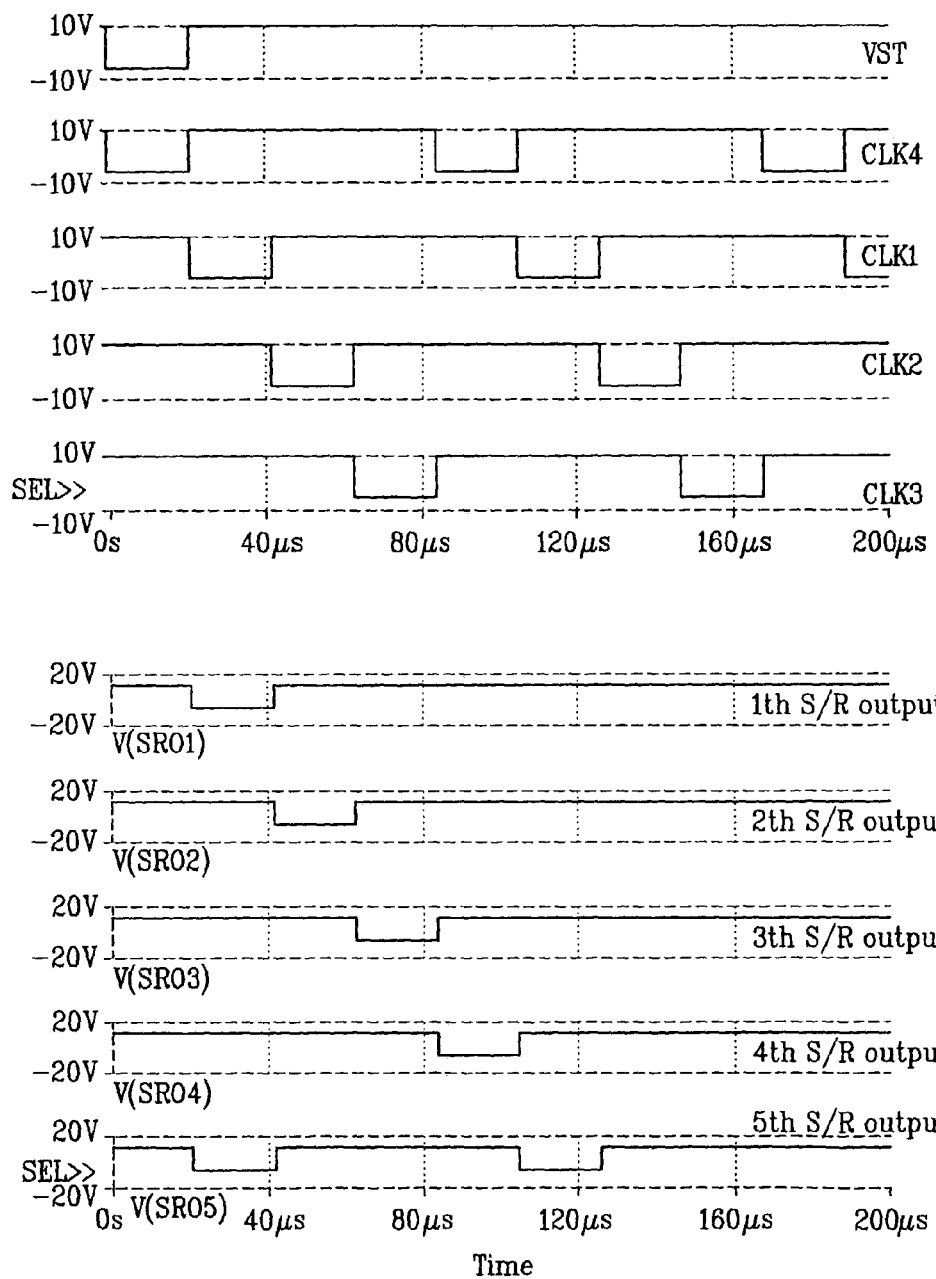
FIG. 8 illustrates forward input and output waveforms of the shift register of the LCD panel of FIG. 7 according to the related art.
Figure 9:
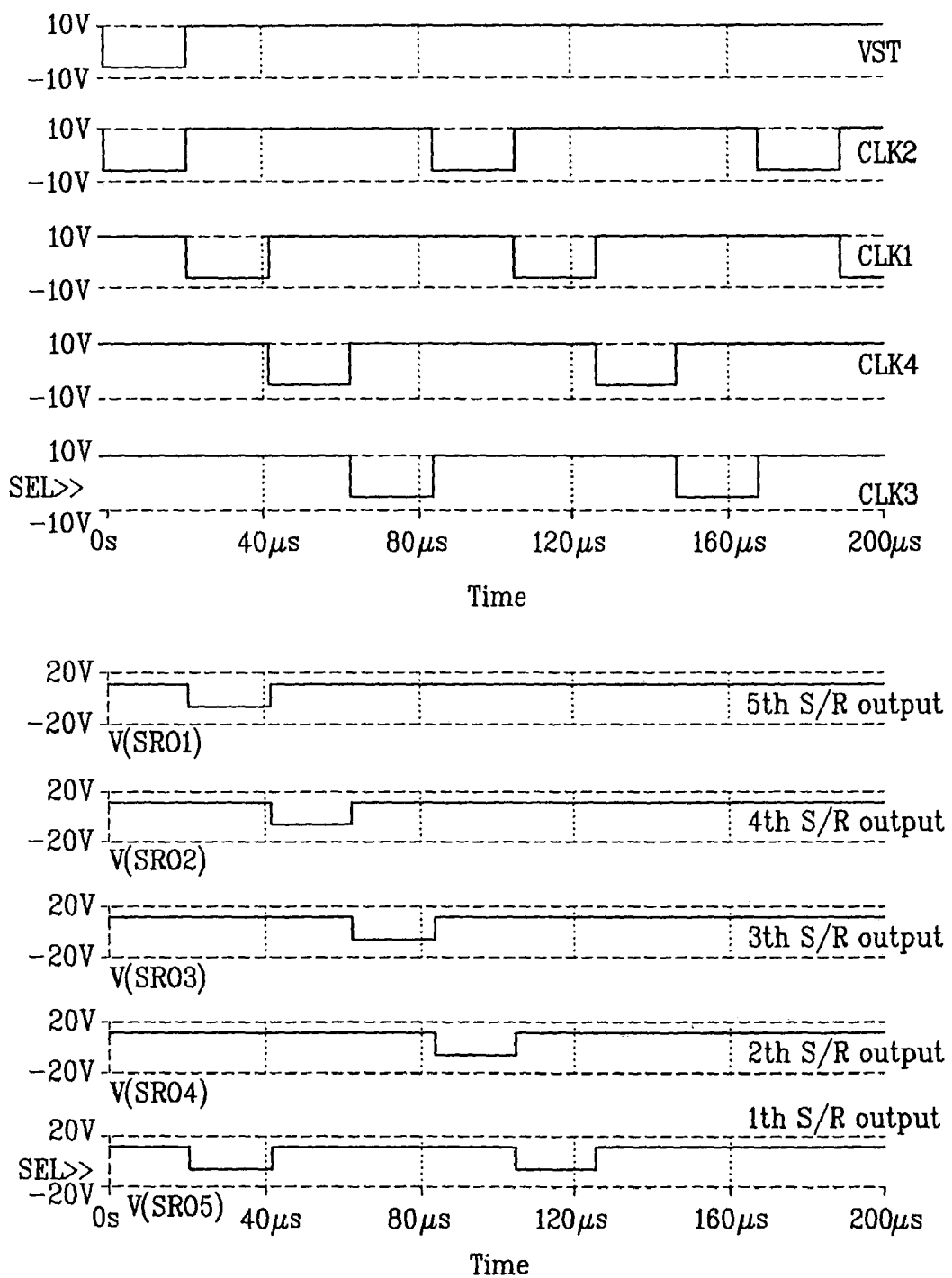
FIG. 9 illustrates backward input and output waveforms of the shift register of the LCD panel of FIG. 7 according to the related art.
Figure 10:
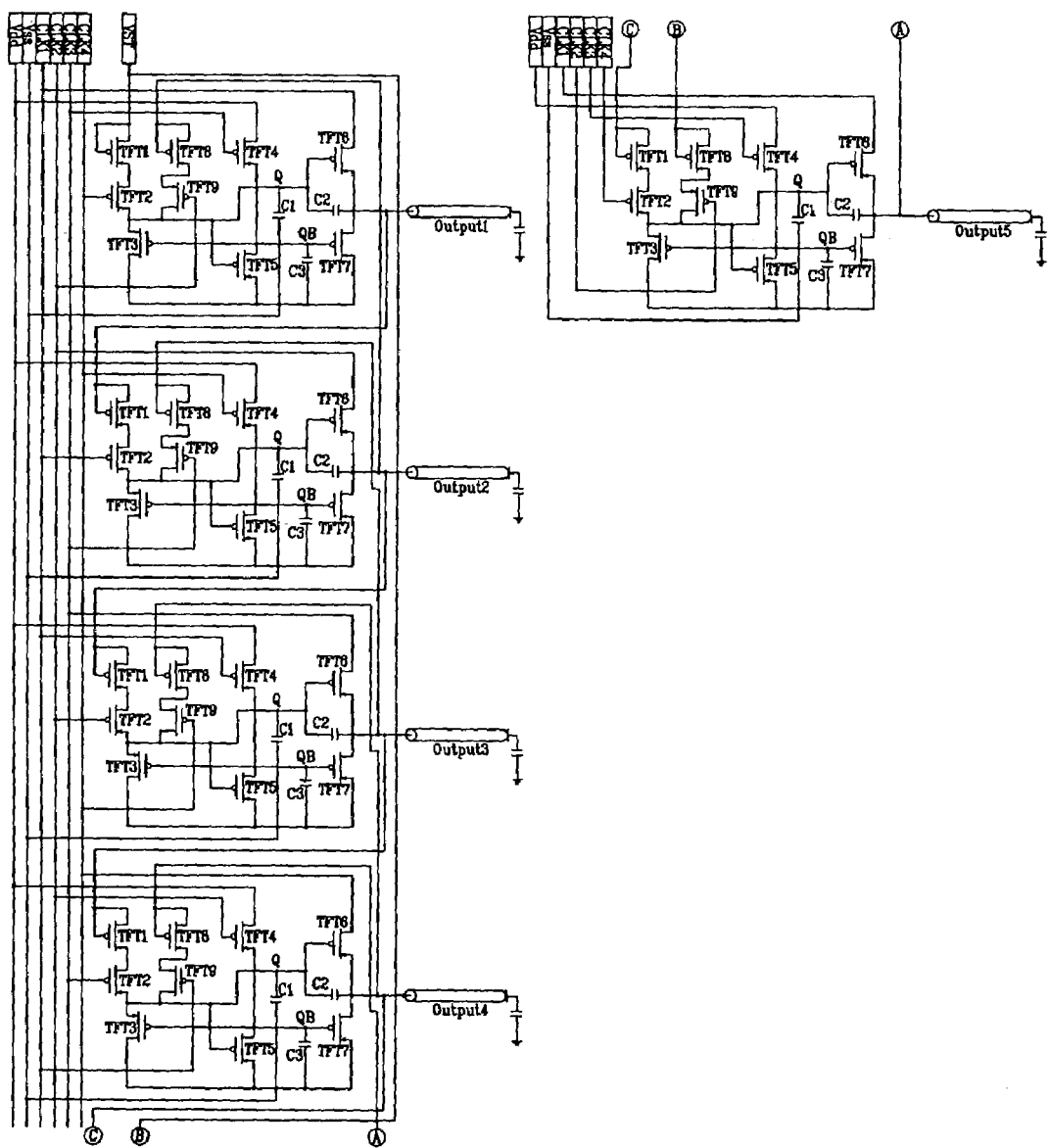
FIG. 10 is a circuit diagram of an exemplary shift register of an LCD panel according to the present invention.

FIG. 10 is a circuit diagram of an exemplary shift register of an LCD panel according to the present invention. In FIG. 10, a gate or data start pulse VST, four clock signals CLK1–CLK4 each having different phases, and power drain voltages Vdd and Vss may be input to a shift register. In addition, the shift register may have five blocks of transistor each having similar structures. Each of the five blocks may include first, second, third, fourth, fifth, sixth, seventh, eight, and ninth p-MOS transistor TFT1–TFT9. In particular, the first transistor TFT1 may have drain and gate terminals to which the start pulse VST is supplied or connected to an output terminal of the previous block. For example, in the first block, the drain and gate terminals of the first transistor TFT1 may be connected to receive the start pulse VST, and in the second block, the drain and gate terminals of the first transistor TFT1 may be connected to the first output terminal Output1. The second transistor TFT2 may have a drain terminal connected to a source terminal of the first transistor TFT1, and a gate terminal to which one of the four clock signals CLK1–CLK4 may be supplied. For example, in the first block, the fourth clock signal CLK4 may be supplied, and in the second block, the first clock signal CLK1 may be supplied.

In addition, the third transistor TFT3 may have a source terminal connected to a source terminal of the second transistor TFT2, and a drain terminal connected to the Vss terminal. The fourth transistor TFT4 may have a drain terminal connected to the Vdd terminal, a gate terminal to which one of the four clock signals CLK1–CLK4 is supplied, and a source terminal connected at a node QB to a gate terminal of the third transistor TFT3. For example, in the first block, the third clock signal CLK3 may be supplied, and in the second block, the fourth clock signal CLK4 may be supplied. The fifth transistor TFT5 may have a drain terminal connected at the node QB to the source terminal of the fourth transistor TFT4, a gate terminal connected to a contact node Q between the source terminal of the second transistor TFT2 and the source terminal of the third transistor TFT3, and a source terminal connected to the Vss terminal.

Further, the sixth transistor TFT6 may have a drain terminal to which one of the four clock signals CLK1–CLK4 is supplied, a gate terminal connected at the node Q to the source terminal of the second transistor TFT2, and a source terminal connected to a corresponding output terminal. For example, in the first block, the first clock signal CLK1 may be supplied, and in the second block, the second clock signal CLK2 may be supplied. In addition, in the first block, the source terminal of the sixth transistor TFT6 may be connected to the first output terminal Output1, and in the second block, the source terminal of the sixth transistor TFT6 may be connected to the second output terminal Output2. The seventh transistor TFT7 may have a drain terminal connected to the corresponding output terminal as the source terminal of the sixth transistor TFT6, a gate terminal connected at the node QB to the source terminal of the fourth transistor TFT4 and the gate terminal of the third transistor TFT3, and a source terminal connected to the Vss terminal.

The eighth transistor TFT8 may have drain and gate terminals connected to an output terminal of the next block. For example, in the first block, the drain and gate terminal of the eighth transistor TFT8 may be connected to the second output terminal Output2. Moreover, in the fifth block, the drain and gate terminals of the eight transistor TFT8 may instead receive the start pulse VST. The ninth transistor TFT9 may have a source terminal connected to a source terminal of the eighth transistor TFT8, a gate terminal to which one of the four clock signals CLK1–CLK4 is supplied, and a drain terminal connected at the node Q to the source terminal of the second transistor TFT2 and the gate terminal of the sixth transistor TFT6. For example, in the first block, the second clock signal CLK2 may be supplied, and in the second block, the third clock signal CLK3 may be supplied.

Moreover, a first capacitor may connect the gate terminal of the sixth transistor TFT6 to the Vss terminal. A second capacitor C2 may connect between the gate and source terminals of the sixth transistor TFT6. In addition, a third capacitor C3 may connect the gate terminal of the seventh transistor TFT7 to the Vss terminal.

Accordingly, the first clock signal CLK1 may be supplied to the drain terminal of the sixth transistor TFT6 in the first and the fifth blocks, the gate terminal of the second transistor TFT2 in the second block, the gate terminal of the fourth transistor TFT4 in the third block, and the gate terminal of the ninth transistor TFT9 in the fourth block. The second clock signal CLK2 may be supplied to the gate terminal of the ninth transistor TFT9 in the first and fifth blocks, the drain terminal of the sixth transistor TFT6 in the second block, the gate terminal of the second transistor TFT2 in the third block, and the gate terminal of the fourth transistor TFT4 in the fourth block.

In addition, the third clock signal CLK3 may be supplied to the gate terminal of the fourth transistor TFT4 in the first and fifth blocks, the gate terminal of the ninth transistor TFT9 in the second block, the drain terminal of the sixth transistor TFT6 in the third block, and the gate terminal of the second transistor TFT2 in the fourth block. The fourth clock signal CLK4 may be supplied to the gate terminal of the second transistor TFT2 in the first and fifth blocks, the gate terminal of the fourth transistor TFT4 in the second block, the gate terminal of the ninth transistor TFT9 in the third block, the drain terminal of the sixth transistor TFT6 in the fourth block. Although not shown, if the driving circuit includes eight blocks, the clock signal may be equally supplied to each block of transistors.

Figure 11:
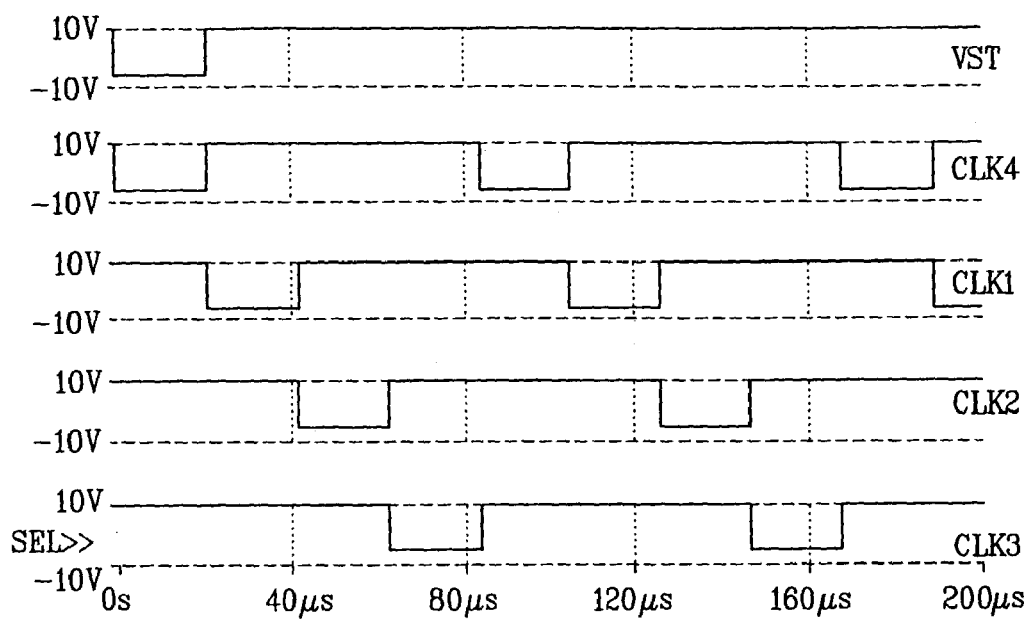
FIG. 11 illustrates forward input and output waveforms of the exemplary shift register of the LCD panel of FIG. 10 according to the present invention.
Figure 11:
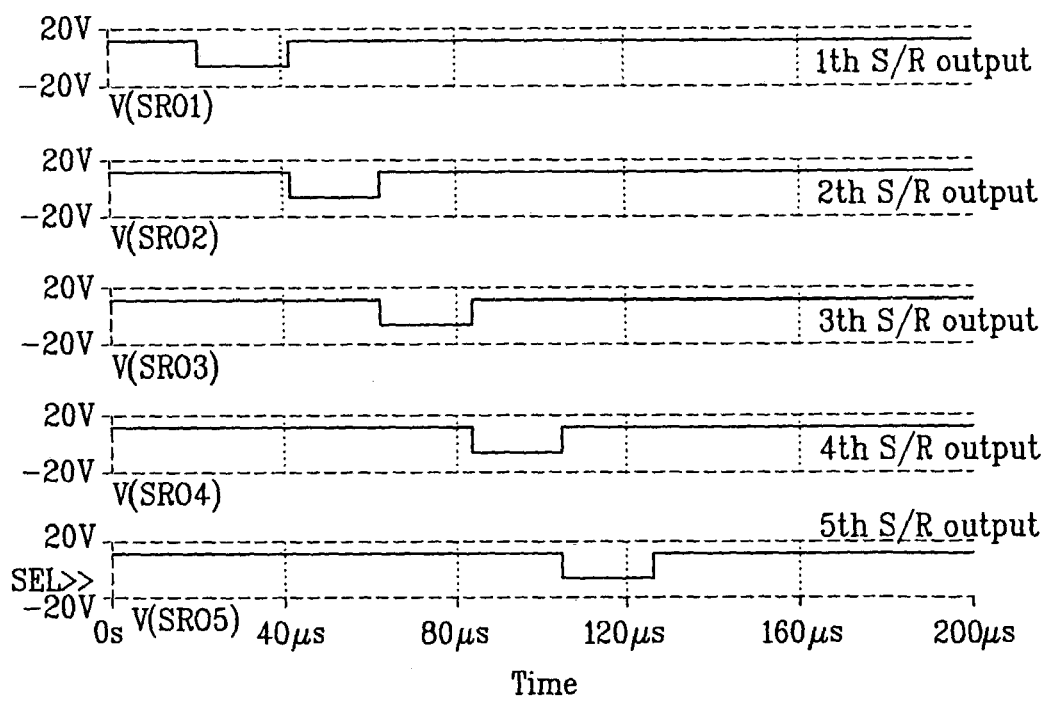

FIG. 11 illustrates forward input and output waveforms of the exemplary shift register of the LCD panel of FIG. 10 according to the present invention. In FIG. 11, the four clock signals may be LOW in sequence. For example, during a first time period, about 0 s–20 μs, the start pulse may be set LOW (0V), thereby turning the first transistor TFT1 (of the first block in FIG. 10) ON. Also, the fourth clock signal CLK4 may be LOW, thereby turning the second transistor TFT2 (in FIG. 10) ON. As a result, the node Q (in FIG. 10) may become LOW. Accordingly, the sixth transistor TFT6 (in FIG. 10) may be turned ON, thereby supplying the first clock signal CLK1 to the first output terminal Output1 (in FIG. 10). In addition, since the second transistor TFT2 (in FIG. 10) may be ON, the fifth transistor TFT5 (in FIG. 10) may also be turned ON, thereby setting the node QB HIGH (10V) as the Vss voltage. Thus, the seventh transistor TFT7 (in FIG. 10) may be turned OFF, and the Vss voltage may not be supplied to the first output terminal Output1 (in FIG. 10).

During a second time period, about 20 μs–40 μs, the first clock signal may be LOW, which may be supplied through the first output terminal Output 1 (in FIG. 10) to the gate terminal of the first transistor TFT1 (of the second block in FIG. 10), and may be directly supplied to the gate terminal of the second transistor TFT2 (in the second clock in FIG. 10). Thus, the first and second transistors TFT1 and TFT2 (in FIG. 10) may be ON, thereby turning the sixth transistor TFT6 (in FIG. 10) ON. Accordingly, the second clock signal CLK2 may be supplied to the second output terminal Output2 (in FIG. 10).

Turning to the fifth block (in FIG. 10), during the first time period when the start pulse VST is set LOW, the second clock signal CLK2 may be set HIGH, thereby turning the ninth transistor TFT9 OFF, even though the eighth transistor TFT8 may be turned ON. Since the ninth transistor TFT9 may be turned OFF, the node Q may be HIGH. Thus, the sixth transistor TFT6 may be OFF and may not output the first clock signal CLK1 to the fifth output terminal Output5. Accordingly, in the fifth block, an output may be generated only when an output of a previous block is supplied in a switch-ON state to the first transistor TFT1, and not when the start pulse VST is set LOW.

Accordingly, the start pulse VST may be initially synchronized with the fourth clock signal CLK4, and the first to third clock signals CLK1 to CLK3 may be sequentially generated, thereby sequentially supplying the four clock signals in a sequence.

Figure 12:
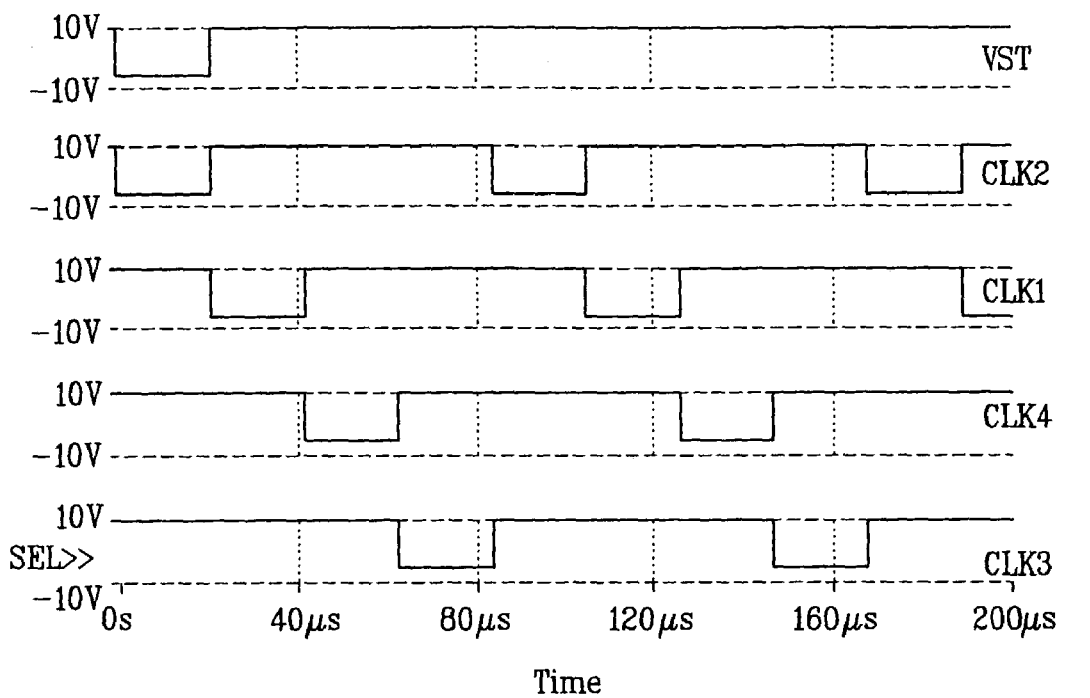
FIG. 12 illustrates backward input and output waveforms of the exemplary shift register of the LCD panel of FIG. 10 according to the present invention.
Figure 12:
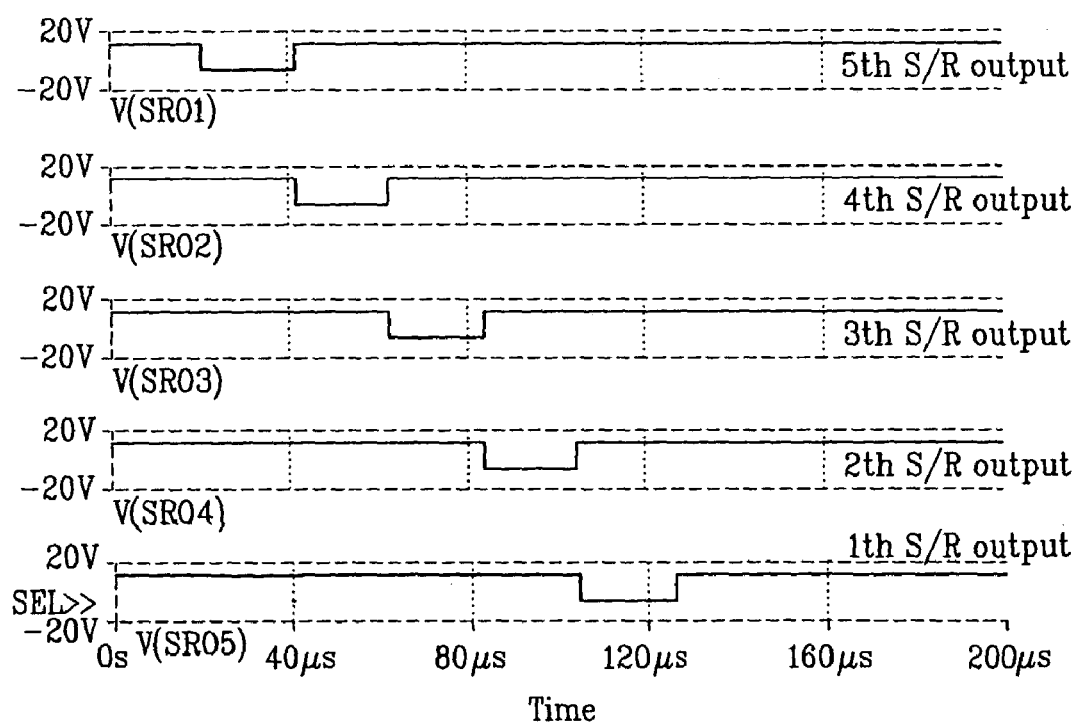

FIG. 12 illustrates backward input and output waveforms of the exemplary shift register of the LCD panel of FIG. 10 according to the present invention. In FIG. 12, the four clock signals may be set LOW in a reverse sequence. For example, in a first time period, about 0 s–20 µs, the start pulse VST and the second clock signal may be set LOW. Thus, in the first block (in FIG. 10), the first transistor TFT1 may be turned ON, the second transistor TFT2 may be turned OFF, thereby turning the sixth transistor TFT6 OFF. As a result, the first block may not supply the first clock signal CLK1 to the first output terminal Output1 (in FIG. 10). However, in the fifth block (in FIG. 10), the eighth transistor TFT8 and the ninth transistor TFT9 may be turned ON, thereby turning the sixth transistor TFT6 ON. As a result, the first clock signal CLK1 may be supplied to the fifth input terminal Output5 (in FIG. 10).

In addition, during a second time period, about 20 µs–40 µs, the signal supplied from the fifth output terminal Output5 may then be supplied to the eighth transistor TFT8 in the fourth block (in FIG. 10). Also, the first clock signal CLK1 may become LOW, thereby turning the eighth and ninth transistors TFT8 and TFT9 in the fourth block (in FIG. 10) ON. As a result, the sixth transistor TFT6 (in FIG. 10) may also be turned ON, thereby supplying the fourth clock signal CLK4 to the fourth output terminal Output4 (in FIG. 10). Hence, the start pulse VST may be initially synchronized with the second clock signal CLK2, and the first to fourth and third clock signals CLK1 to CLK4 and CLK3 may be sequentially generated, thereby repeatedly supplying the four clock signals in a reverse sequence.

Accordingly, the shift register may be driven bi-directionally, such that an LCD panel may operate regardless of panel orientation. In addition, the shift register may be driven without error regardless of how many blocks of transistors it may have.

It will be apparent to those skilled in the art that various modifications and variations can be made in the bi-direction driving circuit and the bi-direction driving method of a liquid crystal display pane of the present invention. Thus, it is intended that the present invention covers the modifications and variations of this invention provided they come within the scope of the appended claims and their equivalents.

What is claimed is:

1. A driving device of a liquid crystal display (LCD) panel having a plurality of blocks arranged in sequence, each of the plurality of blocks comprising:
   a first switching element having drain and gate terminals to which one of a start pulse and an output signal of a previous block in the sequence is supplied;
   a second switching element having a drain terminal connected to a source terminal. of the first switching element, and a gate terminal to which a first clock signal is supplied;
   a third switching element having a source terminal connected to a source terminal of the second switching element, and a drain terminal connected to a first voltage input terminal;
   a fourth switching element having a drain terminal connected to a second voltage input terminal, a gate terminal to receive a second clock signal that is not supplied to the second switching element, and a source terminal connected to a gate terminal of the third switching element;
   a fifth switching element having a drain terminal connected to the source terminal of the fourth switching element, a gate terminal connected to a contact node between the source terminals of the second and third switching elements, and a source terminal connected to the first voltage input terminal;
   a sixth switching element having a drain terminal to receive a third clock signal that is not supplied to the second and fourth switching elements, a gate terminal connected to the contact node, and a source terminal connected to a corresponding output terminal;
   a seventh switching element having a drain terminal connected to the corresponding output terminal, a gate terminal connected to the source terminal of the fourth switching element and the gate terminal of the third switching element, and a source terminal connected to the first voltage input terminal;
   an eighth switching element having drain and gate terminals to which one of the start pulse is supplied and connected to an output terminal of the next block in the sequence; and
   a ninth switching element having a source terminal connected to the source terminal of the eighth switching element, a gate terminal to receive a fourth clock signal that is not supplied to the second, fourth, and sixth switching elements, and a drain terminal connected to the source terminal of the second switching element and the gate terminal of the sixth switching element.

2. The device according to claim 1, further comprising a first capacitor connected between the gate terminal of the sixth switching element and the first voltage input terminal.

3. The device according to claim 2, further comprising a second capacitor connected between the gate and source terminals of the sixth switching element.

4. The device according to claim 3, further comprising a third capacitor connected between the gate terminal of the seventh switching element and the first voltage input terminal.

5. The device according to claim 1, wherein the plurality of blocks includes five blocks.

6. The device according to claim 5, wherein:
   the first clock signal is supplied to the drain terminal of the sixth switching element in first and fifth blocks;
   the second clock signal is supplied to the drain terminal of the sixth switching element in the second block;
   the third clock signal is supplied to the drain terminal of the sixth switching element in a third block, and
   the fourth clock signal is supplied to the drain terminal of the sixth switching element in a fourth block.

7. The device according to claim 5, wherein:
   the third clock signal is supplied to the gate terminal of the fourth switching element in first and fifth blocks;
   the fourth clock signal is supplied to the gate terminal of the fourth switching element in a second block;
   the first clock signal is supplied to the gate terminal of the fourth switching element in a third block, and
   the second clock signal is supplied to the gate terminal of the fourth switching element in a fourth block.

8. The device according to claim 5, wherein:
   the fourth clock signal is supplied to the gate terminal of the second switching element in first and fifth blocks;
   the first clock signal is supplied to the gate terminal of the second switching element in a second block;

the second clock signal is supplied to the gate terminal of the second switching element in a third block, and the third clock signal is supplied to the gate terminal of the second switching element in a fourth block.

9. The device according to claim 5, wherein:

the second clock signal is supplied to the gate terminal of the ninth switching element in first and fifth blocks;

the third clock signal is supplied to the gate terminal of the ninth switching element in a second block;

the fourth clock signal is supplied to the gate terminal of the ninth switching element in a third block, and the first clock signal is supplied to the gate terminal of the ninth switching element in a fourth block.

10. The device according to claim 1, wherein the plurality of blocks includes eight blocks.

11. The device according to claim 10, wherein:

the first clock signal is supplied to the drain terminal of the sixth switching element in first and fifth blocks;

the second clock signal is supplied to the drain terminal of the sixth switching element in second and sixth blocks;

the third clock signal is supplied to the drain terminal of the sixth switching element in third and seventh blocks, and the fourth clock signal is supplied to the drain terminal of the sixth switching element in fourth and eighth blocks.

12. The device according to claim 10, wherein:

the third clock signal is supplied to the gate terminal of the fourth switching element in first and fifth blocks;

the fourth clock signal is supplied to the gate terminal of the fourth switching element in second and sixth blocks;

the first clock signal is supplied to the gate terminal of the fourth switching element in third and seventh blocks, and the second clock signal is supplied to the gate terminal of the fourth switching element in fourth and eighth blocks.

13. The device according to claim 10, wherein:

the fourth clock signal is supplied to the gate terminal of the second switching element in first and fifth blocks;

the first clock signal is supplied to the gate terminal of the second switching element in second and sixth blocks;

the second clock signal is supplied to the gate terminal of the second switching element in third and seventh blocks, and the third clock signal is supplied to the gate terminal of the second switching element in fourth and eighth blocks.

14. The device according to claim 10, wherein:

the second clock signal is supplied to the gate terminal of the ninth switching element in first and fifth blocks;

the third clock signal is supplied to the gate terminal of the ninth switching element in second and sixth blocks;

the fourth clock signal is supplied to the gate terminal of the ninth switching element in third and seventh blocks, and the first clock signal is supplied to the gate terminal of the ninth switching element in fourth and eighth blocks.

15. The device according to claim 1, wherein each of the switching elements includes a p-MOS transistor.

* * * * *